US006924218B2

(12) United States Patent
Marsh et al.

(10) Patent No.: US 6,924,218 B2
(45) Date of Patent: Aug. 2, 2005

(54) SULFIDE ENCAPSULATION PASSIVATION TECHNIQUE

(75) Inventors: Philbert Francis Marsh, Andover, MA (US); Colin S. Whelan, Wakefield, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/321,310

(22) Filed: Dec. 17, 2002

(65) Prior Publication Data

US 2004/0115908 A1 Jun. 17, 2004

(51) Int. Cl.[7] .............................................. H01L 21/44
(52) U.S. Cl. ......................... 438/570; 438/572; 438/92
(58) Field of Search ................................ 438/570, 572, 438/92, 95

(56) References Cited

U.S. PATENT DOCUMENTS

| 5,599,748 | A | * | 2/1997 | Holloway et al. | .......... 438/767 |
| 5,689,125 | A | | 11/1997 | Vaccaro et al. | |
| 5,796,127 | A | | 8/1998 | Hayafuji et al. | |
| 6,197,667 | B1 | * | 3/2001 | Chang et al. | ............... 438/570 |
| 6,380,097 | B1 | | 4/2002 | Dauplaise et al. | |

FOREIGN PATENT DOCUMENTS

| EP | 0469606 A2 | * | 5/1992 | ......... H01L/21/285 |
| EP | 0 498 993 A | | 8/1992 | |

OTHER PUBLICATIONS

Kapila, et al., Optoelectronic and Microelectronics Materials Device Proc. 1996 Conf. pp. 275–282 (1996).*
A. Kapila and V. Malhotra,, "Surface Passivation of III–V Compound Semiconductors," Optoelectronic and Microelectronic Materials and Devices Proceedings, 1996 Conference on, 1996 Page(s): 275 to 282.
C. S. Whelan, P. F. Marsh, W. E. Hoke, R. A. McTaggart, C. P. McCarroll, and T. E. Kazior, "GaAs Metamorphic HEMT (MHEMT): An Attractive Alternative to InP HEMTs for High Performance Low Noise and Power Applications," Indium Phosphide and Related Materials, 2000. Conference Proceedings. 2000 International Conference on, 2000, Page(s): 337–340.
A. Kapila and V. Malhotra, "Passivation of the InP Surface Using Polysulfide and Silicon Nitride Overlayer,"Applied Physics Letters, vol. 62, No. 9, Mar. 1, 1993, Page(s): 1009–1011.
V. L. Berkovits, V. M. Lantratov, T. V. L'vova, G. A. Shakiashvili, and V. P. Ulin, Liquid–Phase Epitaxy on $Al_xGa_{1-x}As$ Surfaces Passivated in Solfide Solutions, Semiconductors 28 (3), Mar. 1994, Page(s) 260 to 265.
"Studies on an (NH4) 2SX–treated GaAs surface using AES. LEELS and RHEED" Japanese Journal of Applied Physics ppgs. 340–342 vol. 28, No. 3 Mar. 1, 1989 by OIGAWA et al.
Intenational Search Report PCT/US 03/33763.
"Gas Phase Polysulfide Passivation of InP for MISFET Fabrication", R. Kwok, et al. Indium Phosphide and Related Materials, 1993. Conference Proceedings., Fifth International Conference on, May 1993 Page(s): 369–371.

* cited by examiner

Primary Examiner—Caridad Everhart
(74) Attorney, Agent, or Firm—Daly, Crowley, Mofford & Durkee, LLP

(57) ABSTRACT

A method for passivating a III-V material Schottky layer of a field effect transistor. The transistor has a gate electrode in Schottky contact with a gate electrode contact region of the Schottky layer. The gate electrode is adapted to control a flow of carriers between a source electrode of the transistor and a drain electrode of such tarnsistor. The transistor has exposed surface portions of the Schottky layer beween the source electrode and the drain electrode adjacent to the gate electrode contact region of the Schottky layer. The method includes removing organic contamination from the exposed surface portions of the Schottky layer using a oxygen plasma. The contamination removed surface portions of the Schottky layer are exposed to a solution of ammonium sulfide and $NH_4OH$. After removal of the solution, the exposed regions are dried in a nitrogen enviroment. A layer of passivating material is deposited over the dried surface portions.

15 Claims, 3 Drawing Sheets

SULFIDE ENCAPSULATION PASSIVATION TECHNIQUE

TECHNICAL FIELD

This invention relates to semiconductor devices, and more particularly to methods for passivating such semiconductor devices.

BACKGROUND

As is known in the art, one type of semiconductor device is high electron mobility transistor (HEMT). As is known in the art, such devices are typically used at microwave and millimeter frequencies to provide amplification of radio frequency signals. Typically, HEMTs are formed from Group III-V materials such as gallium arsenide (GaAs) or indium phosphide (InP). In a HEMT there is a doped donor/undoped spacer layer of one material and an undoped channel layer of a different material. A heterojunction is formed between the doped donor/undoped spacer layer and the undoped channel layer. Due to the conduction band discontinuity at the heterojunction, electrons are injected from the doped donor/undoped spacer layer into the undoped channel layer. Thus, electrons from the large bandgap donor layer are transferred into the narrow bandgap channel layer where they are confined to move only in a plane parallel to the heterojunction. Consequently, there is spatial separation between the donor atoms in the donor layer and the electrons in the channel layer resulting in low impurity scattering and good electron mobility. Thus, with a HEMT, a quantum well is formed between a large bandgap material (InAlAs in MHEMTs) and a small bandgap, high electron mobility channel (In0.60Ga0.40As) channel below it. Silicon, Si, doping is used to introduce electrons for conduction of current. The Si doping is insertion in the InAlAs at the interface with the InGaAs. The electrons all move in the InGaAs and the donors stay in the InAlAs. The electrons can thus achieve high mobility, because they travel in the InGaAs and avoid ionized-impurity scattering due to separation from the donor Si atoms.

One type of HEMT is a pseudomorphic HEMT (pHEMT). Such pHEMTs are formed on GaAs wafers, using strained InGaAs layers for the small bandgap channel layer with ~18-20% indium.

As is also known in the art, metamorphic HEMTs (MHEMTs) are promising devices for solid-state power generation above 60 GHz. MHEMTs are formed on GaAs wafers that use a grading layer to transform the lattice constant from GaAs to near InP. Once this is done, strain-free layers of InGaAs with 53-60% indium can be grown. InAlAs forms the large bandgap layer. The gate electrode is in Schottky contact with this InAlAs layer. The MHEMTs are nearly identical to InP HEMTs except for the substrate. It should be noted that these devices also have a layer of InGaAs above the wideband layer, but it is used only for making ohmic contact. An opening is formed in this layer to put the gate electrode metal down, on the InAlAs layer, to form the Schottky contact.

MHEMTs offer considerably higher gain and efficiency as compared to established GaAs pHEMT technology at nearly the same cost. However, they suffer from surface states between the gate and drain which accumulate electrons and reduce the sheet electron density in the semiconductor channel between gate and drain. This decrease of electron density is passivation dependent and results in increased source and drain resistances, Rs and Rd along with a reduction of the peak drain current capability, Imax. The current reduction, called IV collapse, is most severe when the device's gate voltage is pulsed from −3V to 0V with greater than 0.5V on the drain. Additional reductions in Imax and device gain, Gm, occur gradually under high temperatures. Since the above conditions are encountered under RF power drive and bias, MHEMTs with standard silicon nitride passivation are expected to suffer poor reliability in power RF applications as measured by degradation in RF output power and gain.

Most attempts to solve this reliability problem involve filling an etched gate recess trench with gate metal. This technique attempts to reduce the effect of electron traps, at the semiconductor surface, by allowing the use of a thicker Schottky barrier layer that moves the semiconductor surface with its trapped electrons, farther from the HEMT channel. The resulting increased distance between the trapped electrons and HEMT channel reduces the ability of the trapped electrons to reduce the channel's electron density.

In order for the above method to work well, one must ensure that the gate metal covers the sidewalls of the gate recess trench so that no surface traps are left which would be close to the channel. This implies a minimum of undercut (ungated region) during the gate recess etch. Additionally, the gate metal must not contact the highly conductive cap layer since this would result in a short-circuit of the gate. Such requirements force one to fabricate a complicated double-recessed gate structure in which the gate length and/or ungated region is sensitive to gate etch time and hence difficult to control.

SUMMARY

In accordance with the present invention, a method is provided for passivating a III-V material Schottky layer of a field effect transistor. The transistor has a gate electrode in Schottky contact with a gate electrode contact region of the Schottky layer. The gate electrode is adapted to control a flow of carriers between a source electrode of the transistor and a drain electrode of such transistor. The transistor has exposed surface portions of the Schottky layer beween the source electrode and the drain electrode adjacent to the gate electrode contact region of the Schottky layer. The method includes first removing organic contamination from the exposed surface portions of the Schottky layer. The contamination removed surface portions of the Schottky layer are exposed to a sulfide solution, for example a solution of ammonium sulfide and $NH_4OH$. After removal from the solution, the exposed regions are dried in nitrogen. A layer of passivating material is subsequently deposited over the dried surface portions.

With such method, a passivation technique is provided which has been shown to significantly reduce IV collapse in MHEMTs subjected to pulsed drain voltages. Additional benefits of the new passivation technique are improved reliability with less decline in device transconductance (Gm) and maximum drain current (Imax) under prolonged thermal stress. The beneficial effects of this passivation technique require a high pH combined with encapsulation by silicon nitride. Furthermore, the passivation technique does not require careful timing of gate etching to prevent undercut and can work with selective gate etching to improve reliability and device uniformity. The Encapsulated Sulfide Passivation has been found to give good reliability even while allowing a large exposed Schottky layer area. This allows a single wide gate recess with high reliability while maintaining good manufacturability.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
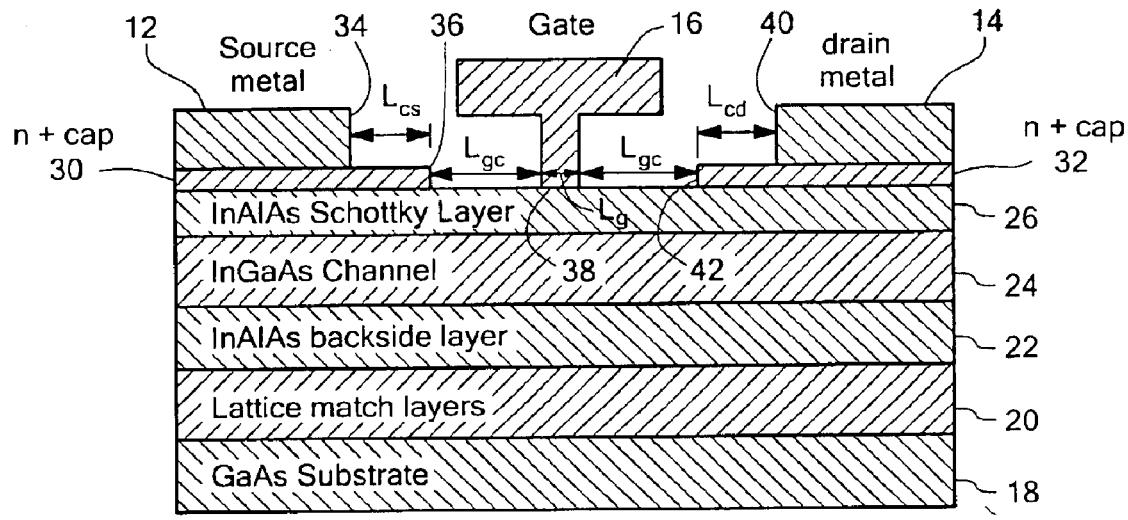
FIG. 1 is a cross sectional sketch of a MHEMT at a stage in the manufacture thereof just prior to the passivation process used thereon according to the invention.

Referring now to FIG. 1, a HEMT 10, here an MHEMT is shown after fabrication of the source, drain and gate electrodes 12, 14 and 16, respectively. Here, in this example, the MHEMT uses a lattice-matching graded buffer layer 20 which matches a GaAs substrate 18 lattice constant to that of a MHEMT backside InAlAs layer 22. Layer 20 allows growth of low-strain high-indium content channels which are conventionally observed in InP-based HEMTs. The MHEMT device is adapted to operate at the high frequencies with the low-noise performance characteristic of InP HEMTs and with the lower cost and better manufacturability associated with GaAs substrates.

Thus the HEMT 10 includes the InAlAs backside layer 22 with an InAlGa channel layer 24, as shown. An InAlAs Schottky layer 26 covers layer 24 to act as an electron barrier which reduces leakage currents between gate and layer 24. The gate electrode 16 forms a Schottky contact with a portion 38 of the AlGaAs Schottky layer 26 for a gate length $L_g$, as shown. An InGaAs n+ cap is grown as the last of the MHEMT layers and etched during the gate etch process to define the separate regions of 30 and 32. Metal source and drain electrodes, 12 and 14 respectively, form low-resistance ohmic contacts to the regions 30 and 32. The length $L_{cs}$ between the edge 34 of the source electrode 12 and the nearest edge 36 of the n+ cap layer 30 is $L_{cs}$; the length between the edge 40 of the drain electrode 14 and the nearest edge 42 of the n+ cap layer 32 is $L_{cd}$. The edges of the gate electrode 16 are distance $L_{gc}$ away from both edges 36 and 42, as indicated. It is noted that the source and drain electrodes, 12 and 14 form ohmic contacts with the n+ cap layer 30 and 32. It is noted that the n+ cap layers 30 and 32 do not touch the gate electrode 16 metal. This process allows the gate and Lgc to be defined using only one resist pattern step. A selective gate etchant, which stops on the InAlAs Schottky layer, is timed to set the desired value of $L_{gc}$. To make the gate etchant, a succinic acid solution is prepared by first mixing 200 gm solid succinic acid with 1000 ml de-ionized water. The pH of the succinic acid solution is adjusted, using $NH_4OH$, to the range 5.1–5.3. After this, the succinic acid solution is filtered and stored. Within an hour of gate etch, the gate etchant is prepared by mixing six parts succinic acid solution with one part of a 30% solution of hydrogen peroxide.

After fabrication of the structure shown in FIG. 1, the upper surface of the structure is exposed to an oxygen plasma to remove organic contamination from exposed regions, 43 and 44, of the InAlAs semiconductor surface.

Next, the contaminate-free surface is dipped in a solution of 2 parts $(NH_4)_2S$, 9 parts $NH_4OH$ for 10 seconds. The $NH_4OH$ and $(NH_4)_2S$ are 20% and 30% water solutions of $NH_3$ and $(NH_4)_2S$ respectively.

After completion of the dip, the InAlAs Schottky surface is blown dry with nitrogen using a blower gun; i.e., a nitrogen spray).

Figure 2:
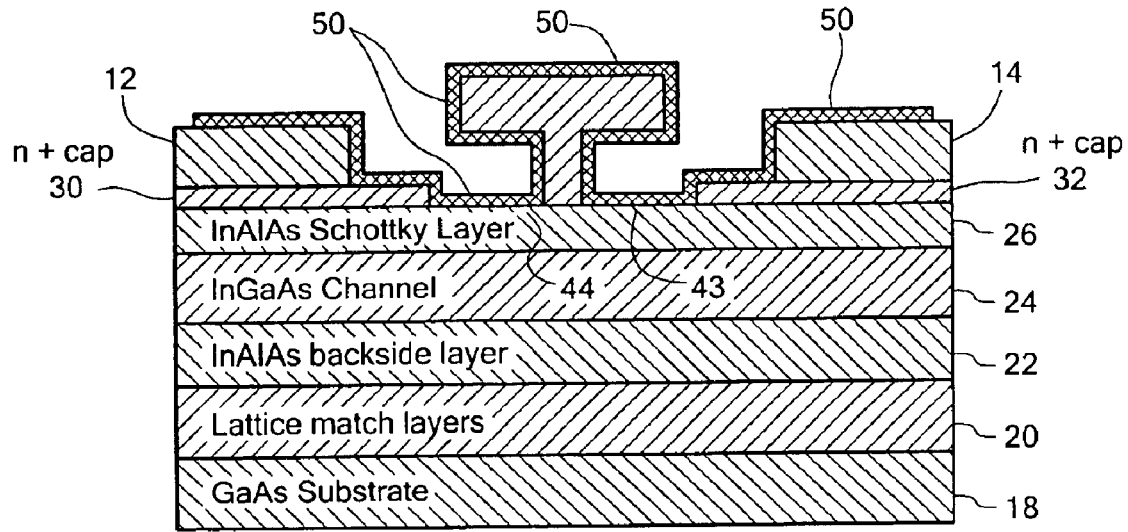
FIG. 2 is a cross sectional sketch of the MHEMT of FIG. 1 after final passivation thereof in accordance with the invention.

Next, a silicon nitride passivation layer 50, as shown in FIG. 2, is formed over the surface of the structure, here using a plasma chemical vapor deposition system (PCVD). The final structure is shown in FIG. 2. In FIG. 2, regions 43 and 44 are the interfaces between the InAlAs layer 26 and the silicon nitride layer 50. The deposition of the silicon nitride passivation layer 50 prevents air from increasing the surface state density of the device at regions 43 and 44. More particularly, surface states on the exposed InAlAs material region 43, between gate and drain can accumulate trapped electrons under pulsed-IV conditions. The trapped electrons on region 43 will deplete electrons in layer 24 (InGaAs channel) and result in IV collapse. This IV collapse will reduce RF power output and gain under the high RF drive conditions encountered in HEMT-based RF power amplifiers. The use the $(NH_4)_2S$ based treatment as described above, reduces surface states on the exposed InAlAs in regions 43 and 44. The silicon nitride passivation layer 50 is deposited to seal the treated surface and prevent degradation of regions 43 and 44. We found that the use of ammonium sulfide solution alone would damage the MHEMT devices by etching the semiconductor layers 30, 32, and 26. In accordance with the invention, the process uses concentrated $NH_4OH$ to obtain a high pH solution which ensures a high concentration of $S^{-2}$ (i.e., sulfur) ions. This is necessary to obtain optimum passivation because these ions form a double bridging bond rather than the less-stable single bond formed by the HS⁻ions, which predominate at pH <13.6.

Results

The process described above has been found to improved stability under high-temperature stress without bias. In order to provide a controlled experiment by which to make a comparison, the base, or standard device process (without ammonium sulfide) included the following steps: 1. expose to an oxygen plasma to remove organic contaminants; 2. a dip for 10 sec in $NH_4OH$: 3. blow dry with nitrogen; and 4. then deposit PCVD silicon nitride.

Figure 3:
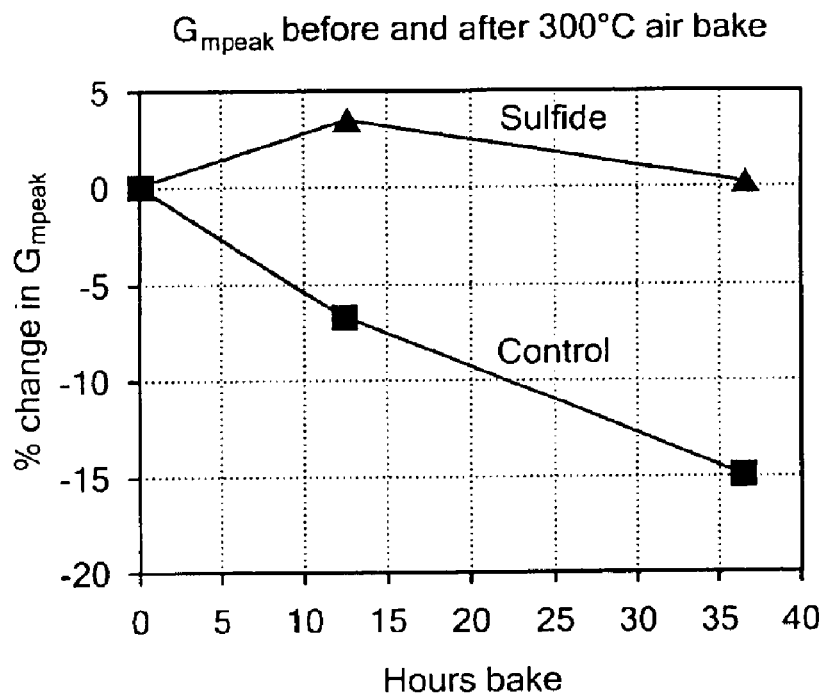
FIG. 3 is a plot illustrating the degradation of $I_{max}$ over time under a no-bias thermal stress.
Figure 4:
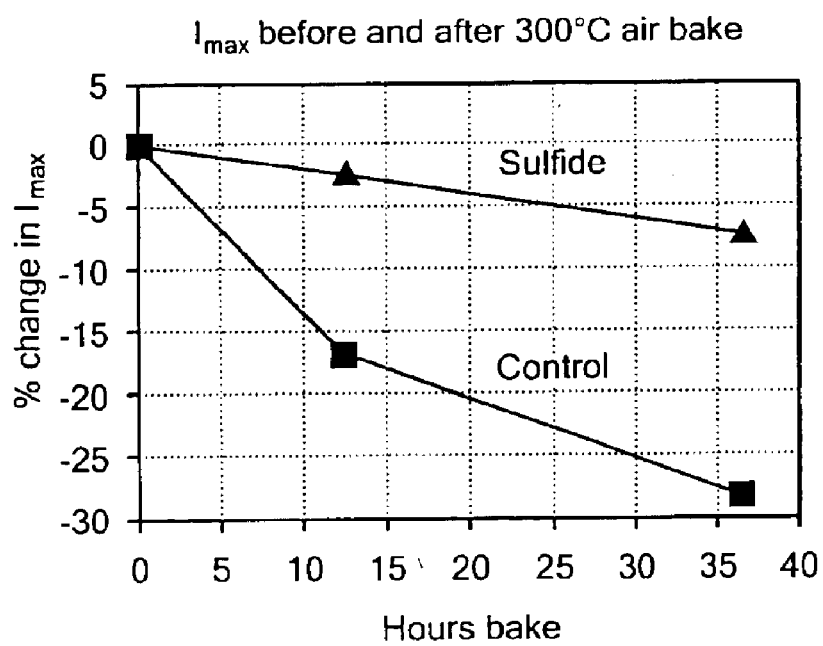
FIG. 4 is a plot illustrating the degradation of $G_{mpeak}$ over time under a no-bias thermal stress.

To test both devices, the DC electrical characteristics were first measured before thermal stress. The devices were then baked in air at 300 C and then cooled and measured at room temperature at various time intervals and restored to the thermal stress bake between measurements. The results are shown in FIGS. 3 and 4. The plots illustrate the degradation of room-temperature $I_{max}$ and $G_{mpeak}$ over time due to a no-bias thermal stress. $I_{max}$ is the maximum available MHEMT drain current, in mA per millimeter of gate width, at a drain-source voltage of 1V. $G_{mpeak}$ is the maximum DC transconductance. Each data point represents the average measurements of a set of four to nine devices. All devices are from the same wafer. MHEMT devices treated according to the Invention (i.e., the process with ammonium sulfide) show significantly less degradation under thermal stress as compared to control devices treated with ammonium hydroxide alone.

Figure 5:
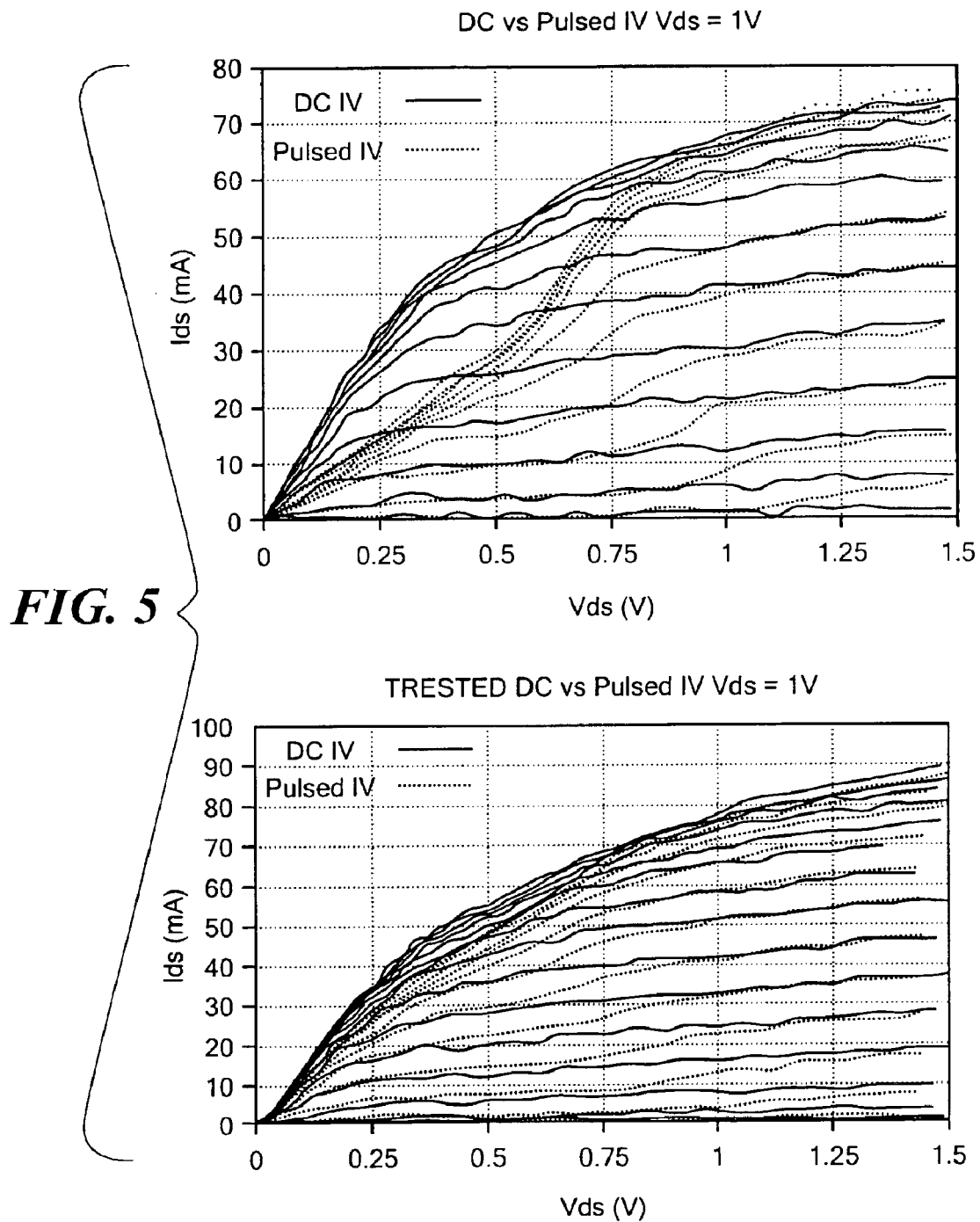
FIG. 5 are DC IV families of curves superimposed on pulsed IV data formed by pulsing the gate of an MHEMT of FIG. 2.

FIG. 5 illustrates the pulsed IV curves from two MHEMTs. Each curve of the IV data is a locus of data points, drain current $I_{ds}$ vs. drain voltage $V_{ds}$, measured at the same gate voltage, $V_{gs}$. $V_{gs}$ is set to a different value for each curve in the family of IV curves. In both plots, the pulsed IV curves are superimposed over the DC IV curves. For the pulsed IV data the drain voltage is slowly swept from 0 V to 1.5 V while the gate-source voltage is pulsed from −3 V to $V_{gsp}$, where $V_{gsp}$ is the value of gate voltage corresponding to the particular curve being traced out on the IV family of curves. The drain current is measured only during the time that the gate voltage is at $V_{gsp}$. Each DC IV curve is plotted by holding $V_{gs}$ constant while sweeping $V_{ds}$ from 0 V to 1.5 V. $V_{gs}$ is stepped to a new value to produce a new DC IV curve. The left MHEMT IV plot is from a control device fabricated via a standard process and the right IV plot is from a device of FIGS. 1 and 2 which incorporated the invention during fabrication. The control MHEMT, in the left plot, shows a significant reduction of the pulsed drain current, $I_d$ at $V_{ds}$<0.7V while the device incorporating the invention, in the right plot, showed a very slight difference between pulsed and DC IV curves. The improved pulsed IV characteristics of devices fabricated using the the invention should improve their RF power output and gain, with respect to the standard fabricated devices, especially under the high RF input drive conditions commonly found in RF power amplifiers. The pulsed IV plots are superimposed on DC IV plots. The pulsed IV data were formed by setting $V_{ds}$ and pulsing the gate from $V_{gs}$=−3V to the on-state gate voltage as represented by each curve. The left MHEMT IV plot is from a control device fabricated via a standard process without using the invention. The right IV plot is from a device which incorporated the invention during fabrication. Both devices are from the same wafer.

From the above, thermally driven degradation has been reduced and pulsed IV characteristics improved for improved RF power performance. Conventional methods to achieve similar results seek to reduce the effects of the InAlAs surface states by using a thick InAlAs Schottky layer 26 and recessing the gate metal into this layer and/or reducing $L_{gc}$ (FIG. 1). The former method moves the InAlAs surface states further from the channel, thus reducing their effects. The latter method reduces the surface state effects by reducing the exposed InAlAs surface area, i.e., region 43. The recessed gate method generally requires a separate etch step to move the n+ cap the desired ($L_{gc}$) distance away from the gate metal to obtain an acceptably high gate-drain breakdown voltage. However, the conventional methods require one to perform at least two gate lithographies and etch procedures namely, the first recess, which removes only the n+ cap and sets $L_{gc}$, followed by the gate lithography step which is used to pattern the gate and set the gate length, $L_g$. Following the gate lithography step, a gate etch is performed to form a channel in the InAlAs, i.e. the gate recess, into which the gate metal is evaporated.

The process according to the invention allows one to fabrication the gate using just one selective etch of the n+ cap layer. In this case, the gate etch is timed to give the correct amount of undercut which defines $L_{gc}$. One need not etch the InAlAs because the InAlAs thickness can be set to produce the optimum electrical characteristics while the invention reduces the InAlAs surface states and their effects to low levels. Additionally, the invention allows more freedom to increase $L_{gc}$ to improve breakdown voltage with less regard to the effects of the InAls surface states. The process according to the invention uses a relatively safe and simple procedure to reduce surface states in MHEMT devices. It recognizes the need for high pH of the ammonium sulfide solution to obtain the optimum surface state reduction. It also recognizes the need to obtain the required high pH using a volatile alkaline material, e.g., ammonium hydroxide so as to avoid the need for a water rinse. A water rinse would likely remove the sulfide coating and reduce the effectiveness of the procedure. The invention also recognizes the need to coat the sulfide-treated surfaces with silicon nitride or some other hermetic encapsulant. The process, according to the invention, permanently reduces IV collapse and improves reliability under thermal stress.

A number of embodiments of the invention have been described. Nevertheless, it will be understood that various modifications may be made without departing from the spirit and scope of the invention. For example, the ratio of ammonium hydroxide solution to ammonium sulfide solution may be varied. Variations in the strength of the precursor ammonium hydroxide and/or ammonium sulfide shall also be considered an implementation of the invention. The invention will also include the above sulfide treatment of III-V field-effect transistors structures for all values of indium and/or aluminum content in the III-V field-effect transistors' material layer structures. Accordingly, other embodiments are within the scope of the following claims.

What is claimed is:

1. A method for passivating a III-V material Schottky layer of a field effect transistor having a gate electrode in Schottky contact with a gate electrode contact region of the Schottky layer, the gate electrode being adapted to control a flow of carriers between a source electrode of the transistor and a drain electrode of such transitor, the transistor having exposed surface portions of the Schottky layer beween the source electrode and the drain electrode adjacent to the gate electrode contact region of the Schottky layer, such method comprising:

exposing the surface portions of the Schottky layer to a sulfide solution;

drying the exposed surface portions in a nitrogen environment after removal of the solution; and, including: removing organic contamination using an oxygen plasma, from the exposed surface portions of the Schottky layer prior to exposing such surface portions to the solution.

2. The method recited in claim 1 including depositing a layer of passivating material over the dried surface portions.

3. A method for passivating a III-V material Schottky layer of a field effect transistor having a gate electrode in Schottky contact with a gate electrode contact region of the Schottky layer, the gate electrode being adapted to control a flow of carriers between a source electrode of the transistor and a drain electrode of such transistor, the transistor having exposed surface portions of the Schottky layer beween the source electrode and the drain electrode adjacent to the gate electrode contact region of the Schottky layer, such method comprising:

exposing the surface portions of the Schottky layer to a sulfide solution and including:

removing organic contamination via oxygen plasmas, from the exposed surface portions of the Schottky layer prior to exposing such surface portions to the solution;

drying the exposed surface portions using a nitrogen spray after removal of the solution and wherein the solution includes ammonium sulfide.

4. The method recited in claim 3 including depositing a layer of passivating material is deposited over the dried surface portions.

5. A method for passivating a III-V material Schottky layer of a field effect transistor having a gate electrode in Schottky contact with a gate electrode contact region of the Schottky layer, the gate electrode being adapted to control a flow of carriers between a source electrode of the transistor and a drain electrode of such transistor, the transistor having exposed surface portions of the Schottky layer beween the source electrode and the drain electrode adjacent to the gate electrode contact region of the Schottky layer, such method comprising:

exposing the surface portions of the Schottky layer to a sulfide solution;
  drying the exposed surface portions in a nitrogen environment after removal of the solution; and
  wherein the solution includes ammonium sulfide; and
  wherein the solution includes 2 parts $(NH_4)_2S$, 9 parts $NH_4OH$ for 10 seconds;
  wherein the drying comprises drying the exposed surface portion using a nitrogen spray after removal of the solution;
  including removing organic contamination from the exposed surface portions of the Schottky layer prior to exposing such surface portions to the solution; and
  including depositing a layer of passivating material is deposited over the dried surface portions.

6. A method for passivating a III-V material Schottky layer of a field effect transistor having a gate electrode in Schottky contact with a gate electrode contact region of the Schottky layer, the gate electrode being adapted to control a flow of carriers between a source electrode of the transistor and a drain electrode of such transistor, the transistor having exposed surface portions of the Schottky layer beween the source electrode and the drain electrode adjacent to the gate electrode contact region of the Schottky layer, such method comprising:

exposing the surface portions of the Schottky layer to a sulfide solution; and
  wherein the Schottky layer is InAlAs material.

7. The method recited in claim 6 wherein the solution includes ammonium sulfide.

8. The method recited in claim 7 wherein the solution includes of 2 parts $(NH_4)_2S$, 9 parts $NH_4OH$ for 10 seconds.

9. The method recited in claim 8 wherein the $NH_4OH$ is a solution of 30 percent $NH_3$ in water.

10. The method recited in claim 7 including: drying the exposed surface portions using a nitrogen spray after removal of the solution.

11. The method recited in claim 10 including: removing organic contamination from the exposed surface portions of the Schottky layer prior to exposing such surface portions to the solution.

12. The method recited in claim 11 including depositing a layer of passivating material is deposited over the dried surface portions.

13. The method recited in claim 9 including: drying the exposed surface using a nitrogen spray after removal of the solution.

14. The method recited in claim 13 including: removing organic contamination from the exposed surface portions of the Schottky layer prior to exposing such surface portions to the solution.

15. The method recited in claim 14 including depositing a layer of passivating material is deposited over the dried surface portions.

* * * * *

UNITED STATES PATENT AND TRADEMARK OFFICE
CERTIFICATE OF CORRECTION

PATENT NO. : 6,924,218 B2
APPLICATION NO. : 10/321310
DATED : August 2, 2005
INVENTOR(S) : Marsh et al.

It is certified that error appears in the above-identified patent and that said Letters Patent is hereby corrected as shown below:

Column 3 line 16, delete "stress." and replace with --stress;--.

Column 3 line 57, delete "layer 30 and 32" and replace with --layers 30 and 32--.

Column 3 line 59, delete "Lge" and replace with --$L_{ge}$--.

Column 4 line 13, delete "spray)" and replace with --spray--.

Column 4 line 29, delete "The use the" and replace with --The use of the--.

Column 4 line 35, delete "30, 32 and 26." And replace with --30, 32 and 36.--.

Column 4 line 43, delete "improved" and replace with --improve--.

Column 4 line 63, delete "devices treated" and replace with --devices are treated--.

Column 4 line 64, delete "Invention" and replace with --invention--.

Column 5 line 7, delete "data the drain" and replace with --data, the drain--.

Column 5 line 23, delete "using the the invention" and replace with --using the invention--.

Column 5 line 65, delete "InAls" and replace with --InAlAs--.

Column 6 line 63, delete "solution and" and replace with --solution; and,--.

UNITED STATES PATENT AND TRADEMARK OFFICE
CERTIFICATE OF CORRECTION

PATENT NO. : 6,924,218 B2
APPLICATION NO. : 10/321310
DATED : August 2, 2005
INVENTOR(S) : Marsh et al.

It is certified that error appears in the above-identified patent and that said Letters Patent is hereby corrected as shown below:

Column 8 line 7, delete "includes of 2 parts" and replace with --includes 2 parts--.

Abstract line 6 delete "tarnsistor" and replace with --transistor.--.

Abstract line 7 delete "beween" and replace with --between--.

Signed and Sealed this

Twenty-fifth Day of July, 2006

JON W. DUDAS
*Director of the United States Patent and Trademark Office*